(12) United States Patent
Kim

(10) Patent No.: US 10,347,706 B2
(45) Date of Patent: Jul. 9, 2019

(54) ORGANIC LIGHT EMITTING DISPLAY APPARATUS HAVING SHIELD LAYER

(71) Applicant: SAMSUNG DISPLAY CO., LTD., Yongin-si, Gyeonggi-do (KR)

(72) Inventor: Yang-Wan Kim, Yongin-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 95 days.

(21) Appl. No.: 15/166,951

(22) Filed: May 27, 2016

(65) Prior Publication Data

US 2016/0276422 A1  Sep. 22, 2016

Related U.S. Application Data

(63) Continuation of application No. 14/317,004, filed on Jun. 27, 2014, now Pat. No. 9,356,085.

(30) Foreign Application Priority Data

Aug. 5, 2013  (KR) .................. 10-2013-0092659

(51) Int. Cl.
  *H01L 27/32* (2006.01)
  *H01L 51/56* (2006.01)
  *H01L 51/52* (2006.01)

(52) U.S. Cl.
  CPC ...... *H01L 27/3272* (2013.01); *H01L 27/3248* (2013.01); *H01L 27/3258* (2013.01); *H01L 27/3262* (2013.01); *H01L 27/3276* (2013.01); *H01L 27/3279* (2013.01);
  (Continued)

(58) Field of Classification Search
  CPC ............ H01L 27/3272; H01L 27/3246; H01L 27/3248; H01L 27/3253; H01L 27/3258; H01L 27/3276
  See application file for complete search history.

(56) References Cited

U.S. PATENT DOCUMENTS 6,225,632 B1  5/2001  Kinno et al.
9,412,801 B2  8/2016  Choi
(Continued)

FOREIGN PATENT DOCUMENTS

KR       10-0730156 B1    6/2007
KR    10-2010-0094819 A    8/2010
(Continued)

OTHER PUBLICATIONS

Korean Office Action dated Apr. 18, 2019.

*Primary Examiner* — Shaun M Campbell
*Assistant Examiner* — Suberr L Chi
(74) *Attorney, Agent, or Firm* — Lee & Morse, P.C.

(57) ABSTRACT

An organic light-emitting display apparatus including a shield layer and a method of manufacturing the same are provided. The organic light-emitting display apparatus includes a substrate having a display area and a peripheral area surrounding the display area. A plurality of first thin film transistors (TFTs) are disposed in the display area of the substrate and a plurality of second TFTs disposed in the peripheral area of the substrate. A shield layer is positioned above the second TFTs and extended to an edge portion of the substrate. The shield layer includes a plurality of through holes in a portion that does not overlap with the second TFTs.

19 Claims, 4 Drawing Sheets

(52) U.S. Cl.
CPC .......... *H01L 51/56* (2013.01); *H01L 51/5246* (2013.01); *H01L 2227/323* (2013.01)

(56) References Cited

U.S. PATENT DOCUMENTS

| | | | |
|---|---|---|---|
| 2007/0034875 A1* | 2/2007 | Yamazaki | H01L 27/12 257/59 |
| 2007/0096633 A1 | 5/2007 | Lee et al. | |
| 2009/0002591 A1* | 1/2009 | Yamazaki | G02F 1/1368 349/43 |
| 2009/0268145 A1 | 10/2009 | Anjo et al. | |
| 2011/0198572 A1 | 8/2011 | Park et al. | |
| 2011/0207254 A1 | 8/2011 | Lee | |
| 2013/0009162 A1 | 1/2013 | Kang | |

FOREIGN PATENT DOCUMENTS

| | | |
|---|---|---|
| KR | 10-2011-0093510 A | 8/2011 |
| KR | 10-1097335 B1 | 12/2011 |
| KR | 10-2013-0005877 A | 1/2013 |
| KR | 10-2013-0031101 | 3/2013 |

\* cited by examiner

ORGANIC LIGHT EMITTING DISPLAY APPARATUS HAVING SHIELD LAYER

CROSS-REFERENCE TO RELATED APPLICATIONS

This is a continuation application based on pending application Ser. No. 14/317,004, filed Jun. 27, 2014, the entire contents of which is hereby incorporated by reference The present application claims priority under 35 U.S.C. § 119 to Korean Patent Application No. 10-2013-0092659, filed on Aug. 5, 2013, in the Korean Intellectual Property Office, and entitled: "Organic Light-Emitting Display Apparatus and Method Of Manufacturing The Same," which is incorporated by reference herein in its entirety.

BACKGROUND

1. Field

One or more embodiments of the present disclosure relate to an organic light-emitting display apparatus and a method of manufacturing the same.

2. Description of the Related Art

An organic light-emitting display apparatus is a light-emitting apparatus having a large viewing angle, good contrast, rapid response time, good luminance, and good properties concerning a driving voltage and a response. The display may be polychromatic. An organic light-emitting display apparatus may include organic light-emitting devices including a thin film transistor (TFT) on a substrate, and an area in which the organic light-emitting devices are formed is a display unit of the organic light-emitting display apparatus. Around the display unit, a driving unit including the TFT may be formed.

SUMMARY

One or more embodiments of the present disclosure include an organic light-emitting display apparatus having a shield layer and a method of manufacturing the same. Additional aspects will be set forth in part in the description which follows and, in part, will be apparent from the description, or may be learned by practice of the presented embodiments.

According to one or more embodiments of the present disclosure, an organic light-emitting display apparatus includes a substrate including a display area and a peripheral area surrounding the display area. A plurality of first thin film transistors (TFTs) may be disposed in the display area of the substrate and a plurality of second TFTs may be disposed in the peripheral area of the substrate. A shield layer may be positioned above the second TFTs and extended to an edge portion of the substrate. The shield layer may include a plurality of through holes that do not overlap with the second TFTs. The apparatus may further include a plurality of pixel electrodes disposed on the plurality of first TFTs. The shield layer may be disposed on a same layer as the plurality of pixel electrodes. The shield layer may include a same material as the pixel electrode. The shield layer may be included in the peripheral area and/or excluded from the display area.

The apparatus may further include a plurality of light-emitting devices including a plurality of pixel electrodes electrically connected to the plurality of first TFTs, an opposite electrode facing the plurality of pixel electrodes, and an intermediate layer disposed between the plurality of pixel electrodes and the opposite electrodes. The intermediate layer may include an emission layer. An electrode power supply line may be positioned in the peripheral area of the substrate. One side of the shield layer may contact the opposite electrode, and another side of the shield layer may contact the electrode power supply line.

The apparatus may further include a second insulating layer between the plurality of first TFTs and the plurality of second TFTs with the pixel electrode. The second insulating layer may be disposed to expose the electrode power supply line, and the one side of the shield layer may be disposed on the second insulating layer. The plurality of through holes of the shield layer may be positioned in the second insulating layer.

The apparatus may further include a third insulating layer covering an edge portion of the plurality of pixel electrodes to expose a center portion of the plurality of pixel electrodes and covering at least a portion of the shield layer on the second insulating layer. The third insulating layer may include a plurality of opening portions exposing a plurality of areas of the shield layer positioned on the second insulating layer. The opposite electrode may contact the plurality of areas of the shield layer through the plurality of opening portions of the third insulating layer.

According to one or more embodiments of the present disclosure, a method of manufacturing an organic light-emitting display apparatus may include preparing a substrate including a display area and a peripheral area surrounding the display area. A plurality of first TFTs may be formed in the display area of the substrate and a plurality of second TFTs may be formed in the peripheral area of the substrate. A shield layer may be formed above the second TFTs and extended to an edge portion of the substrate. The shield layer may be provided with a plurality of through holes that do not overlap with the second TFTs.

The forming of the shield layer may include forming a plurality of pixel electrodes for electrical connections with the plurality of first TFTs, and the shield layer. The forming of the plurality of first TFTs and the plurality of second TFTs may include forming the plurality of first TFTs and the plurality of second TFTs, and an electrode power supply line in a same layer as one among electrodes included in the plurality of first TFTs and the plurality of second TFTs. The forming of the shield layer may include forming the shield layer in which one side of the shield layer may contact an opposite electrode, and another side of the shield layer may contact the electrode power supply line.

The method may further include forming a second insulating layer covering the plurality of first TFTs and the plurality of second TFTs, between the forming of the plurality of first TFTs and the plurality of second TFTs, and the forming of the plurality of pixel electrodes. In addition, the forming of the shield layer may include forming one side of the shield layer on the second insulating layer. The forming of the shield layer may include forming the shield layer so that one side of the shield layer formed on the second insulating layer includes a plurality of through holes.

The method may further include forming a third insulating layer covering an edge portion of the plurality of pixel electrodes to expose a center portion of the plurality of pixel electrodes on the plurality of pixel electrodes between the forming of the plurality of pixel electrodes and the forming of the intermediate layer. The method may further include forming an opposite electrode corresponding to the plurality of pixel electrodes after forming the intermediate layer. In addition, the forming of the opposite electrode may include forming the opposite electrode so as to contact an exposed portion of the plurality of areas of the shield layer by the third insulating layer.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
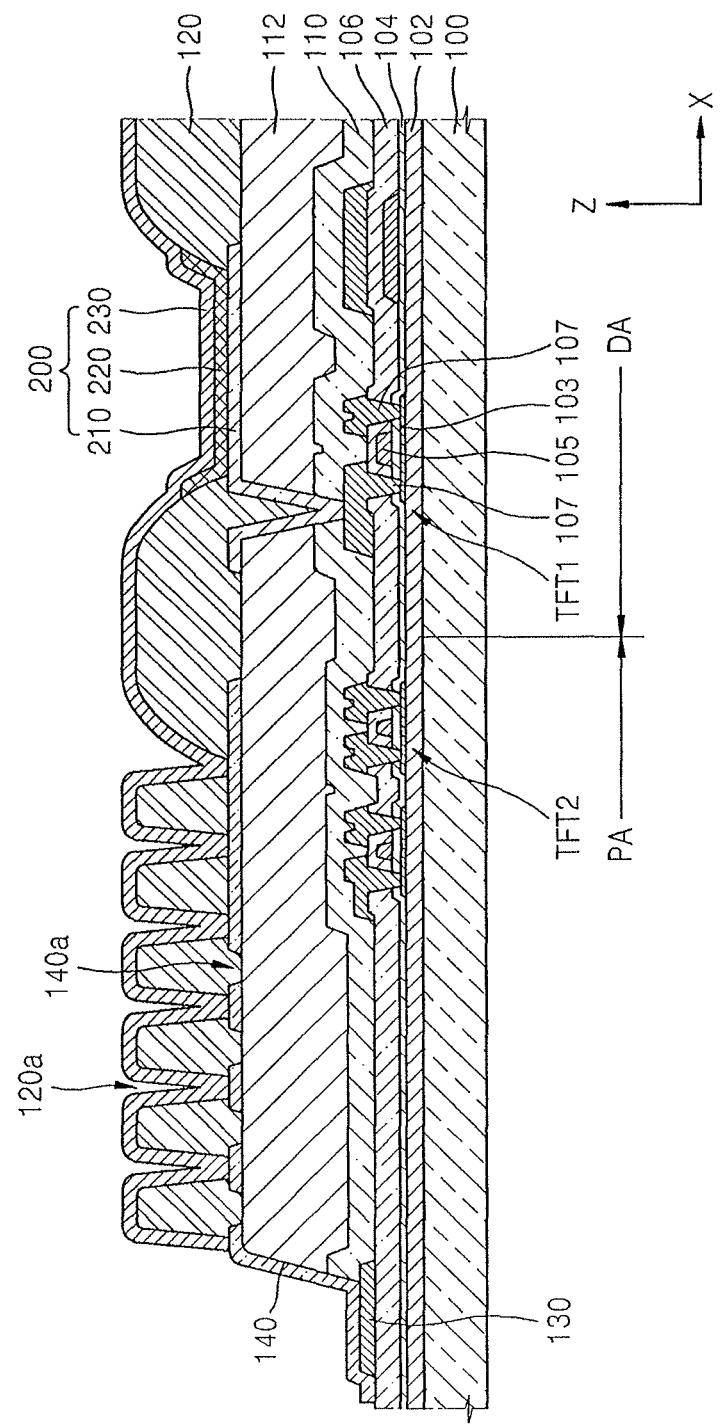
FIG. 1 illustrates a cross-sectional view of an organic light-emitting display apparatus according to an exemplary embodiment of the present disclosure.

Example embodiments will now be described more fully hereinafter with reference to the accompanying drawings; however, they may be embodied in different forms and should not be construed as limited to the embodiments set forth herein. In the drawing figures, the dimensions of layers and regions may be exaggerated for clarity of illustration. In other words, since sizes and thicknesses of components in the drawings are arbitrarily illustrated for convenience of explanation, the following embodiments are not limited thereto. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. It will be understood that when a layer, region, or component is referred to as being "formed on," another layer, region, or component, it can be directly or indirectly formed on the other layer, region, or component. That is, for example, intervening layers, regions, or components may be present.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are described herein, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 illustrates a cross-sectional view of an organic light-emitting display apparatus according to an exemplary embodiment of the present disclosure. As illustrated in FIG. 1, an organic light-emitting display apparatus according to the present disclosure includes a substrate 100, a plurality of first thin film transistors TFT1, a plurality of second thin film transistors TFT2 disposed on the substrate 100, and a shield layer 140 including through holes 140a disposed above the plurality of second thin film transistors TFT2. The substrate 100 includes a display area DA and a peripheral area PA surrounding the display area DA. The substrate 100 may be formed by using various materials such as a glass material, a metal material, a plastic material, or the like. The display area DA is a region for disposing organic light-emitting devices 200, and the peripheral area PA surrounding the display area DA is a dead space not displaying an image. A driving unit applying electrical signals to the display area DA may be positioned in the peripheral area PA.

In the display area DA of the substrate 100, a plurality of first thin film transistors TFT1 are disposed. In addition to the plurality of first thin film transistors TFT1, the organic light-emitting devices 200 electrically connected to the plurality of first thin film transistors TFT1 may be also disposed in the display area DA. That is, a plurality of the organic light-emitting devices 200, for example, of organic light-emitting diodes, is disposed in the display area DA. The electrical connection of the organic light-emitting devices 200 and the plurality of thin film transistors may be understood as the electrical connection of the plurality of pixel electrodes 210 and the plurality of first thin film transistors TFT1. In the peripheral area PA surrounding the display area DA, the second thin film transistors TFT2 may be disposed. The second thin film transistors TFT2 may be a portion of the driving unit controlling electrical signals applied to the display area DA.

The first thin film transistor TFT1 and/or the second thin film transistor TFT2 includes a semiconductor layer 103 including amorphous silicon, polycrystalline silicon, or an organic semiconductor material, a gate electrode 105, and source/drain electrodes 107. On the substrate 100, a buffer layer 102 formed by using silicon oxide, silicon nitride, or the like may be disposed to planarize the surface of the substrate 100 or to prevent penetration of impurities into the semiconductor layer 103. The semiconductor layer 103 may be positioned on the buffer layer 102.

On the semiconductor layer 103, the gate electrode 105 may be disposed. According to applied signals to the gate electrode 105, the source/drain electrodes 107 may make an electrical communication. The gate electrode 105 may be formed as a single layer or a multi-layer by using at least one material from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), considering adhesiveness with an adjacent layer, a surface planarization degree of a layer to be stacked, and processability. To confirm the insulating properties between the semiconductor layer 103 and the gate electrode 105, a gate insulating layer 104 formed by using silicon oxide and/or silicon nitride may be disposed between the semiconductor layer 103 and the gate electrode 105.

On the gate electrode 105, an interlayer insulating layer 106 may be provided. The interlayer insulating layer 106 may be formed as a single layer or a multi-layer by using silicon oxide or silicon nitride. On the interlayer insulating layer 106, the source/drain electrodes 107 may be disposed. The source/drain electrodes 107 may be electrically connected to the semiconductor layer 103, respectively through contact holes formed in the interlayer insulating layer 106 and the gate insulating layer 104. The source/drain electrode 107 may be formed as a single layer or a multi-layer by using at least one material from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), considering conductivity, and the like.

To passivate the first thin film transistor TFT1 and/or the second thin film transistor TFT2, a first insulating layer 110, which is a passivation layer covering the first thin film transistor TFT1 and/or the second thin film transistor TFT2, may be disposed. The first insulating layer 110 may be formed by using an inorganic material such as, for example, silicon oxide, silicon nitride, or silicon oxynitride. In FIG. 1, although the first insulating layer 110 is illustrated as a single layer structure, it may have various modifications including a multi-layer structure.

On the first insulating layer 110, a second insulating layer 112 may be disposed as occasion demands. In this case, the second insulating layer 112 may be a planarization layer or a passivation layer. When the organic light-emitting device 200 is disposed above the first thin film transistor TFT1 as illustrated in FIG. 1, the second insulating layer 112 may be disposed as the planarization layer for planarizing the upper surface of the first insulating layer 110 covering the first thin film transistor TFT1. The second insulating layer 112 may be formed by using, for example, an acryl-based organic material or benzocyclobutene (BCB). In FIG. 1, although the second insulating layer 112 is illustrated as a single layer, it may have various modifications including a multi-layer.

In the display area DA of the substrate 100, the organic light-emitting device 200 including a pixel electrode 210, an opposite electrode 230, and an intermediate layer 200 disposed therebetween and including a light-emitting layer, is provided. In the first insulating layer 110 and the second insulating layer 112, an opening portion exposing at least one of the source/drain electrodes 107 of the first thin film transistor TFT1 may be formed. The pixel electrode 210 making an electrical connection with the first thin film transistor TFT1 by contacting at least one of the source/drain electrodes 107 through the opening portion, may be disposed on the second insulating layer 112. The pixel electrode 210 may be formed as a (semi)transparent type electrode or a reflection type electrode. The (semi)transparent type electrode may be formed by using, for example, ITO, IZO, ZnO, $In_2O_3$, IGO or AZO. The reflection type electrode may include a reflection layer formed by using Ag, Mg, Al, Pt, Pd, Au, Ni, Nd, Ir, Cr and a compound thereof, and a layer formed by using ITO, IZO, ZnO, $In_2O_3$, IGO and/or AZO. The present disclosure is not limited thereto. In addition, the structure of the pixel electrode 210 may have various modifications such as a single layer structure and a multi-layer structure.

A third insulating layer 120 may be disposed on the second insulating layer 112. The third insulating layer 120 may be a pixel defining layer including opening portions corresponding to each sub-pixel, covering edge portions of the plurality of pixel electrodes 210 and exposing at least a center portion thereof for defining a pixel. As illustrated in FIG. 1, generation of an arc at an end portion of the pixel electrode 210 may be prevented by the third insulating layer 120 by increasing the distance between the end portion of the pixel electrode 210 and the opposite electrode 230 above the pixel electrode 210. The third insulating layer 210 may be formed by using an organic material such as polyimide. The third insulating layer 120 may be accepted as the pixel defining layer, defines a pixel region, and may be disposed in the display area DA of the substrate. As illustrated in the drawing, the third insulating layer 120 may be enlarged to the peripheral area PA surrounding the display area DA of the substrate.

The intermediate layer 220 of the organic light-emitting device 200 may include a low molecular weight material and/or a high molecular weight material. When the intermediate layer 220 includes the low molecular weight material, a hole injection layer (HIL), a hole transport layer (HTL), an emission layer (EML), an electron transport layer (ETL), an electron injection layer (EIL), and the like may be formed as a single layer or as a complex layer by stacking thereof. Applicable organic material may include various materials such as copper phthalocyanine (CuPc), N,N'-di (naphthalene-1-yl)-N,N'-diphenyl-benzidine (NPB), tris-8-hydroxyquinoline aluminum (Alq3), and the like. The intermediate layer 220 may be formed by, for example, a vacuum deposition method or the like.

When the high molecular weight material is used, the intermediate layer 220 may have a structure including the HTL and the EML. In this case, the HTL may be formed by using poly(3,4-ethylenedioxythiophene)-poly(styrenesulfonate) (PEDOT), and the EML may be formed by using the high molecular weight material such as poly-phenylenevinylene (PPV) and polyfluorene, for example, by a screen printing method, an inkjet printing method, a laser induced thermal imaging (LITI) method, or the like. The structure of the intermediate layer 220 is not limited thereto, and the intermediate layer 220 may have a different structure.

The opposite electrode 230 may be disposed on the entire upper surface of the display area DA and the peripheral area PA surrounding the display area DA. The opposite electrode 230 may be disposed to cover, for example, the entire upper surface of the display area DA and the peripheral area PA surrounding the display area DA as illustrated in FIG. 1. The opposite electrode 230 may be formed as one body with respect to the plurality of organic light-emitting devices 200 to correspond to the plurality of pixel electrodes 210.

The opposite electrode 230 may be formed as a (semi) transparent-type electrode or a reflection-type electrode. When the opposite electrode 230 is formed as the (semi) transparent-type electrode, the opposite electrode 230 may include a layer formed by using a metal having a low work function such as Li, Ca, LiF/Ca, LiF/Al, Al, Ag, Mg, and/or a compound thereof, and/or a (semi)transparent and conductive layer of ITO, IZO, ZnO or $In_2O_3$. When the opposite electrode 230 is formed as the reflection-type electrode, a layer formed by using Li, Ca, LiF/Ca, LiF/Al, Al, Ag, Mg, and/or a compound thereof may be included. The constitution and the material of the opposite electrode 230 are not limited thereto, and various modifications may be made without deviating from the present disclosure.

As illustrated in FIG. 1, an electrode power supply line 130 may be disposed on the interlayer insulating layer 106. The electrode power supply line 130 may be positioned in the peripheral area PA surrounding the display area DA of the substrate 100, and may be positioned at the same layer as one of the electrodes included in the plurality of thin film transistors TFT1 and TFT2. For example, the electrode power supply line 130 may be positioned at the same layer as the source/drain electrodes 107 among the electrodes included in the plurality of thin film transistors TFT1 and TFT2. In this case, the electrode power supply line 130 may be formed by using the same material as the source/drain electrodes 107 at the same time in the manufacturing process of the source/drain electrodes 107.

The shield layer 140 may be positioned in the peripheral area PA surrounding the display area DA. A first side 140*b* (see FIG. 3) of the shield layer 140 may be disposed on, for example, directly on, the second insulating layer 112. The shield layer 140 may function to passivate the driving unit from static electricity.

The first insulating layer 110 and the second insulating layer 112 may be further disposed between the plurality of thin film transistors TFT1 and TFT2, and the pixel electrode 210, and the first insulating layer 110, and the second insulating layer 112 may be disposed to cover at least a portion of the edge portion of the electrode power supply line 130. In this case, the first side 140*b* of the shield layer 140 may be disposed on the second insulating layer 112. In the first side 140*b* of the shield layer 140 disposed on the second insulating layer 112, a plurality of through holes 140*a* may be formed. Out-gassing from an organic layer under the pixel electrode 210 may be provided through the plurality of through holes 140*a*, when an anode shield structure such as the shield layer 140 is applied. However, when a portion of the plurality of through holes 140*a* is positioned above, for example, to overlap, the second thin film transistors TFT2, the driving unit might not be passivated from static electricity.

In an exemplary embodiment of the present disclosure, the shield layer 140 is positioned above the second thin film transistors TFT2, is extended to an edge portion of the substrate 100 (in an x-axis direction), and includes a plurality of the through holes 140*a*, for example, only, in a portion that does not overlap with the second thin film transistors TFT2. Thus, as the plurality of through holes 140*a* of the shield layer 140 does not overlap the second thin film transistors TFT2, out-gassing of the organic layer may be provided through this structure, and the passivation of the driving unit from the static electricity may be achieved.

On the first thin film transistors TFT1, a plurality of the pixel electrodes 210 may be disposed, and the shield layer 140 may be disposed, for example, directly, on the same layer as the pixel electrodes 210. The shield layer 140 may be considered to be formed simultaneously while forming the pixel electrode 210, and the shield layer 140 may be considered to include the same material as the pixel electrode 210.

The shield layer 140 may be positioned above the second thin film transistors TFT2 and extend to the edge portion of the substrate 100 (in an x-axis direction). The first side 140*b* of the shield layer 140 may contact the opposite electrode 230, and a second side 140*c* (see FIG. 3) of the shield layer 140 may contact the electrode power supply line 130. The contacting portion with the opposite electrode 230 among the first side 140*b* of the shield layer 140 may be a portion of the shield layer 140 exposed by the third insulating layer 120. The third insulating layer 120 disposed in the peripheral area PA surrounding the display area DA may be disposed on the through holes 140*a* of the shield layer 140 and may include a plurality of opening portions 120*a* covering, for example, overlapping, the edge portions of a plurality of areas, for example, discrete portions of the shield layer 140 defining the through holes 140*a* therebetween, of the shield layer 140 and exposing the center portions of the areas. The opposite electrode 230 may contact a plurality of the areas of the shield layer 140 through the plurality of opening portions 120*a* included in the third insulating layer 120 disposed on the plurality of through holes 140*a* of the shield layer 140.

When the shield layer 140 having an anode shield structure for passivating the driving unit from the static electricity is provided in the organic light-emitting display apparatus, the through holes 140*a* for preventing out-gassing defects of the underlying organic layer may be formed. When through holes are formed above and overlapping the second thin film transistor TFT2, the passivation of the driving unit from the static electricity may be weak. Thus, in the organic light-emitting display apparatus according to an exemplary embodiment of the present disclosure, the driving unit may be passivated from the static electricity by excluding the through holes 140*a* above the second thin film transistors TFT2, that is, excluding through holes 140*a* that may overlap with the TFT2. The shield layer 140 may be included in the peripheral area and/or excluded from the display area. For example, the shield layer 140 may be situated so that it does not extend from the peripheral area into the display area.

Figure 2:
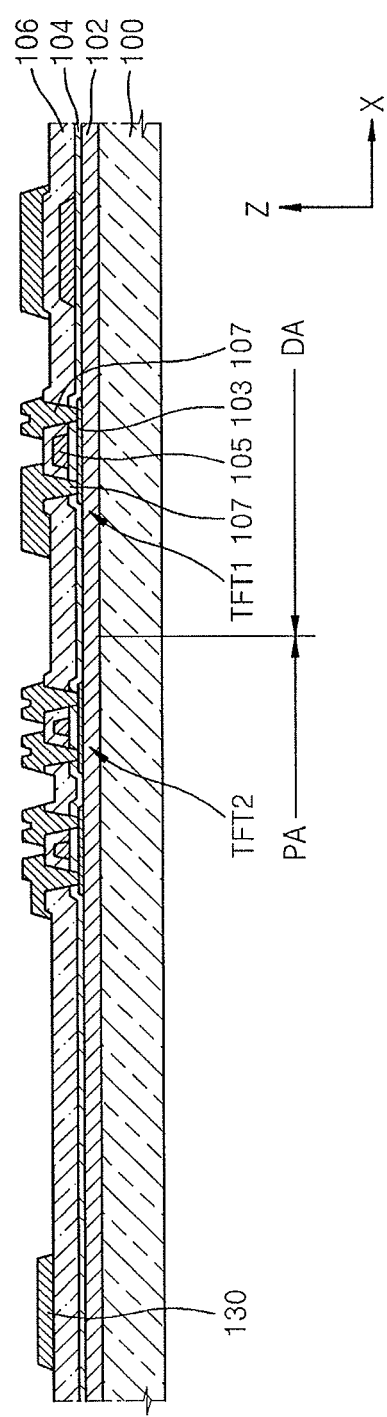
FIGS. 2 to 4 illustrate cross-sectional views of stages in a method of manufacturing an organic light-emitting display apparatus according to an exemplary embodiment of the present disclosure.
Figure 3:
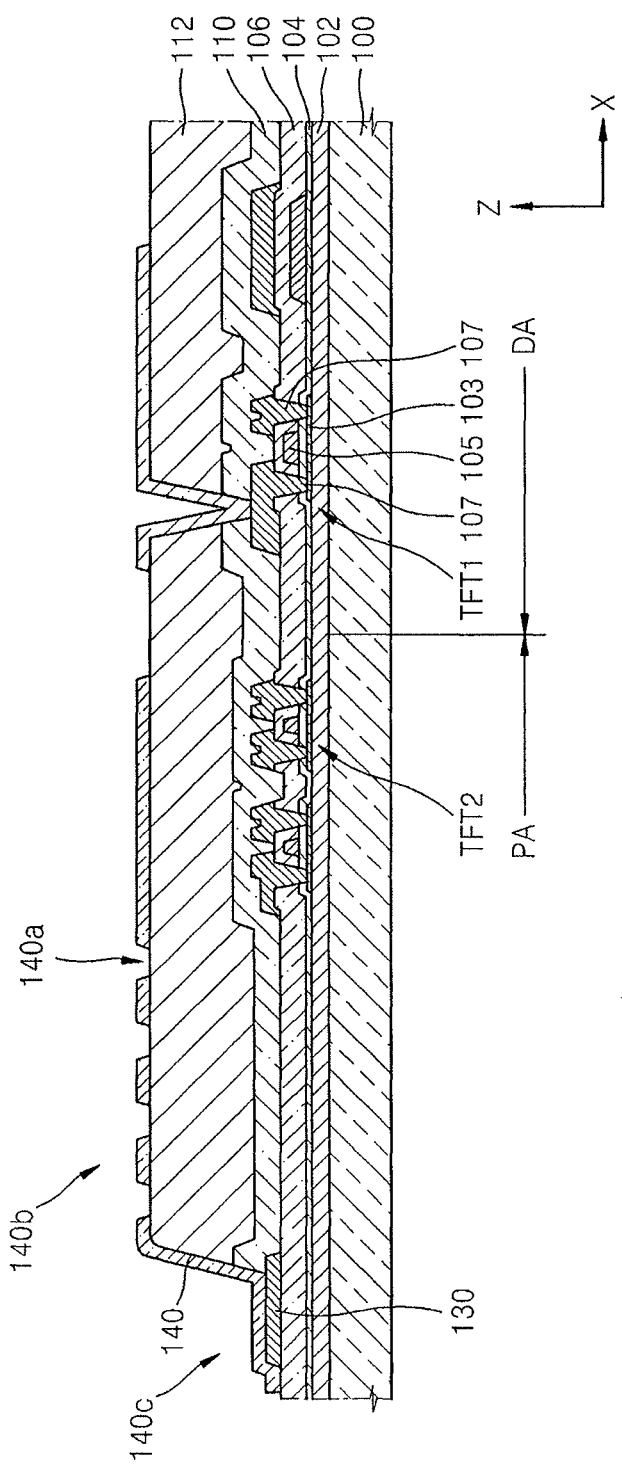
Figure 4:
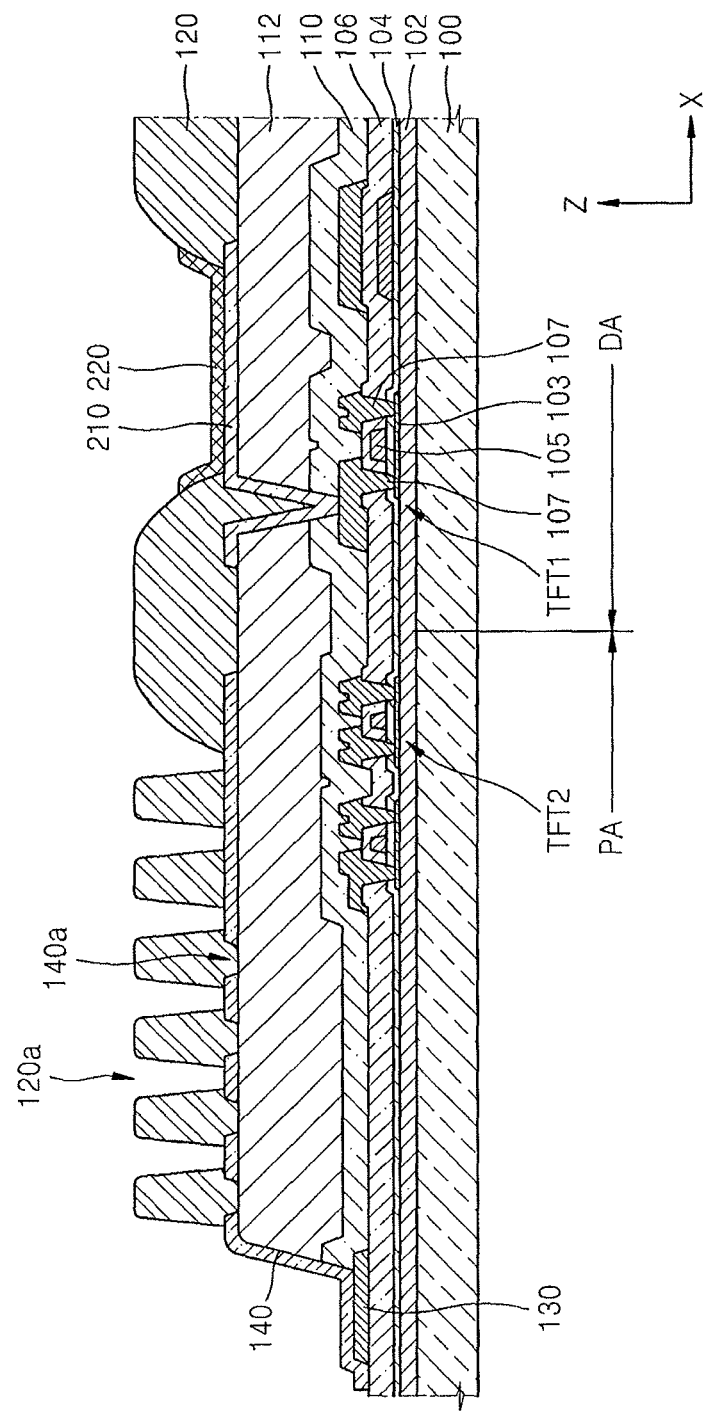

FIGS. 2 to 4 illustrate cross-sectional views of a method of manufacturing an organic light-emitting display apparatus according to an exemplary embodiment of the present disclosure. Referring to FIG. 2, the substrate 100 including the display area DA and the peripheral area PA surrounding the display area DA is prepared, and the plurality of first thin film transistors TFT1 in the display area DA and the plurality of second thin film transistors TFT2 in the peripheral area surrounding the display area DA are formed.

The forming step of the plurality of thin film transistors TFT1 and TFT2 may include forming a buffer layer 102 on the substrate 100 and patterning a semiconductor layer 103 on the buffer layer 102. After patterning the semiconductor layer 103, the gate insulating layer 104 may be stacked on the semiconductor layer 103, and the gate electrode 105 may be patterned on the gate insulating layer 104. On the gate insulating layer 104, source/drain electrodes 107 electrically connected to the semiconductor layer 103 may be patterned. When forming the plurality of thin film transistors TFT1 and TFT2, the electrode power supply line 130 may be formed in the same layer as one of the electrodes included in the plurality of thin film transistors TFT1 and TFT2 at the same time. As illustrated in the drawing, the electrode power supply line 130 may be formed at the same layer as the source/drain electrodes 107 of the plurality of thin film transistors TFT1 and TFT2. However, the present disclosure is not limited thereto.

Referring to FIG. 3, the first insulating layer 110 and the second insulating layer 112 may be stacked on the plurality of thin film transistors TFT1 and TFT2. The first insulating layer 110 may be understood as a passivation layer passivating the plurality of thin film transistors TFT1 and TFT2. The second insulating layer 112 may be understood as a passivation layer passivating the plurality of thin film transistors TFT1 and TFT2 or a planarization layer planarizing the upper surface of the second insulating layer 112. On the second insulating layer 112, the plurality of pixel electrodes 210 electrically connected to one of the source/drain electrodes 107 of the first thin film transistor TFT1 may be formed. In this case, the plurality of pixel electrodes 210 may be formed on the first thin film transistor TFT1 in the display area DA.

While forming the pixel electrodes 210 in the display area DA, the shield layer 140 may be formed above the second thin film transistors TFT2 disposed in the peripheral area PA surrounding the display area DA. The shield layer 140 is formed to passivate the driving unit of the organic light-emitting display apparatus from static electricity. The shield layer 140 may be understood as an anode shield structure. The shield layer 140 may be extended to the edge portion of the substrate 100 above the second thin film transistor TFT2.

The first side 140b of the shield layer 140 may contact the opposite electrode 230, and the second side of the shield layer 140 may contact the electrode power supply line 130.

The first side 140b of the shield layer 140 may be formed above the second insulating layer 112, and the first side 140b of the shield layer 140 formed on the second insulating layer 112 may include the plurality of through holes 140a. The out-gassing from an organic layer under the pixel electrode 210 may be provided through the presence of the plurality of through holes 140a, when applying an anode shield structure such as the shield layer 140. When some of the plurality of through holes 140a are positioned above the second thin film transistors TFT2, the driving unit might not be passivated from the static electricity. In a method of manufacturing an organic light-emitting display apparatus according to an exemplary embodiment of the present disclosure, the plurality of through holes 140a do not have to overlap the second thin film transistors TFT2. In the above structure, the out-gassing of the organic layer may be performed, and the driving unit may be passivated from the static electricity.

As illustrated in FIG. 4, after forming the pixel electrodes 210 and the shield layer 140 on the second insulating layer 112, the third insulating layer 120 may be formed on the pixel electrode 210 and the shield layer 140. The third insulating layer 120 formed on the pixel electrode 210 functions as a pixel defining layer. The third insulating layer 120, which is the pixel defining layer, may be formed to cover edge portions of the pixel electrodes 210 to expose center portions of the plurality of pixel electrodes 210. The third insulating layer 120 may be also formed on the shield layer 140. The shield layer 140 may be formed to cover the plurality of through holes 140a as illustrated in FIG. 4. In this case, the third insulating layer 120 may be formed to expose the plurality of areas of the shield layer 140.

After forming the third insulating layer 120 on the pixel electrode 210 and the shield layer 140, an intermediate layer 220 including an EML may be formed on the pixel electrode 210. After forming the intermediate layer 220, the opposite electrode 230 corresponding to the plurality of pixel electrodes 210 may be further formed. In this case, the structure thus obtained may be the same as the structure in FIG. 1. For example, the opposite electrode 230 may be formed on the entire surface of the third insulating layer 120 as illustrated in FIG. 1. In this case, the opposite electrode 230 may be formed to contact a portion exposed by the third insulating layer 120 among the plurality of areas of the shield layer 140.

In a method of manufacturing an organic light-emitting display apparatus, through holes 140a for preventing out-gassing defects of an underlying organic layer may be provided, for example, when the shield layer 140 having an anode shield structure is formed to passivate a driving unit from static electricity. When, for example, through holes are present above and overlapping the second thin film transistors TFT2, the passivation of the driving unit from the static electricity may be weak. Therefore, in a method of manufacturing an organic light-emitting display apparatus, the through holes 140a may be formed in a non-overlapping relationship with the second thin film transistors TFT2, thereby facilitating the out-gassing and the passivation of the driving unit of the organic light-emitting display apparatus from the static electricity.

By way of summation and review, because static electricity may be generated in a driving unit of an organic light-emitting display apparatus, a shield layer may be disposed on the driving unit to prevent such generation. However, gas generated from underlying layers may not be exhausted out due to the presence of a conventional shield layer. In contrast, an organic light-emitting display apparatus, by which out-gassing is enabled, and damage to a driving unit due to static electricity of an organic light-emitting display panel is prevented, is provided herein. A method of manufacturing the same is also provided herein.

While one or more embodiments of the present disclosure have been described with reference to the figures, it will be understood by those of ordinary skill in the art that various changes in form and details may be made therein without departing from the spirit and scope of the present disclosure as defined by the following claims. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. An organic light-emitting display apparatus, comprising:
   a substrate including a display area and a peripheral area surrounding the display area;
   a plurality of first thin film transistors (TFTs) disposed in the display area of the substrate, and a plurality of second TFTs disposed in the peripheral area of the substrate;
   an intermediate layer disposed between a plurality of pixel electrodes and an opposite electrode, the plurality of pixel electrodes electrically connected to the plurality of first TFTs, the opposite electrode facing the plurality of pixel electrodes, the intermediate layer including an emission layer;
   an electrode power supply line positioned in the peripheral area of the substrate; and
   a shield layer positioned above the second TFTs and electrically separated from the second TFTs, the shield layer including a plurality of through holes,
   wherein a first side of the shield layer contacts the opposite electrode, and a second side of the shield layer contacts the electrode power supply line.

2. The organic light-emitting display apparatus as claimed in claim 1, wherein:
   the plurality of pixel electrodes are on the plurality of first TFTs, and
   the shield layer and the plurality of pixel electrodes are on a same layer.

3. The organic light-emitting display apparatus as claimed in claim 2, wherein the shield layer includes a same material as the plurality of pixel electrodes.

4. The organic light-emitting display apparatus as claimed in claim 1, further comprising:
   a plurality of light-emitting devices including the plurality of pixel electrodes electrically connected to the plurality of first TFTs, the opposite electrode facing the plurality of pixel electrodes, and the intermediate layer.

5. The organic light-emitting display apparatus as claimed in claim 4, further comprising a second insulating layer on the plurality of first TFTs and the plurality of second TFTs, wherein the second insulating layer is disposed to expose the electrode power supply line, and the first side of the shield layer is disposed on the second insulating layer.

6. The organic light-emitting display apparatus as claimed in claim 5, wherein the plurality of through holes of the shield layer are positioned in the second insulating layer.

7. The organic light-emitting display apparatus as claimed in claim 5, further comprising a third insulating layer covering an edge portion of the plurality of pixel electrodes to expose a center portion of the plurality of pixel electrodes and covering at least a portion of the shield layer on the second insulating layer, the third insulating layer including a plurality of opening portions exposing a plurality of areas of the shield layer positioned on the second insulating layer.

8. The organic light-emitting display apparatus as claimed in claim 7, wherein the opposite electrode contacts the plurality of areas of the shield layer through the plurality of opening portions of the third insulating layer.

9. The organic light-emitting display apparatus as claimed in claim 1, wherein the shield layer does not extend into the display area.

10. The organic light-emitting display apparatus as claimed in claim 1, wherein the plurality of through holes of the shield layer are in a portion that does not overlap the second TFTs.

11. A method of manufacturing an organic light-emitting display apparatus, the method comprising:
preparing a substrate including a display area and a peripheral area surrounding the display area;
forming a plurality of first thin film transistors (TFTs) in the display area of the substrate, and a plurality of second TFTs in the peripheral area of the substrate;
forming an intermediate layer between a plurality of pixel electrodes and an opposite electrode, the plurality of pixel electrodes electrically connected to the plurality of first TFTs, the opposite electrode facing the plurality of pixel electrodes, the intermediate layer including an emission layer;
forming an electrode power supply line in the peripheral area of the substrate; and
forming a shield layer above the second TFTs, the shield layer being electrically separated from the second TFTs and having a plurality of through holes,
wherein a first side of the shield layer contacts the opposite electrode, and a second side of the shield layer contacts the electrode power supply line.

12. The method of manufacturing the organic light-emitting display apparatus as claimed in claim 11, wherein forming the shield layer includes forming the plurality of pixel electrodes for electrical connections with the plurality of first TFTs and the shield layer.

13. The method of manufacturing the organic light-emitting display apparatus as claimed in claim 11, wherein forming the plurality of first TFTs and the plurality of second TFTs includes forming the plurality of first TFTs and the plurality of second TFTs, and the electrode power supply line including a same material as one among electrodes included in the plurality of first TFTs and the plurality of second TFTs.

14. The method of manufacturing the organic light-emitting display apparatus as claimed in claim 13, wherein forming the shield layer includes forming the shield layer in which the first side of the shield layer contacts the opposite electrode, and the second side of the shield layer contacts the electrode power supply line.

15. The method of manufacturing the organic light-emitting display apparatus as claimed in claim 13, further comprising forming a second insulating layer covering the plurality of first TFTs and the plurality of second TFTs after forming the plurality of first TFTs and the plurality of second TFTs, wherein forming the shield layer includes forming the first side of the shield layer on the second insulating layer.

16. The method of manufacturing the organic light-emitting display apparatus as claimed in claim 15, wherein forming the shield layer includes forming the shield layer so that the first side of the shield layer formed on the second insulating layer includes the plurality of through holes.

17. The method of manufacturing the organic light-emitting display apparatus as claimed in claim 13, further comprising forming a third insulating layer covering an edge portion of the plurality of pixel electrodes to expose a center portion of the plurality of pixel electrodes on the plurality of pixel electrodes between forming the plurality of pixel electrodes and the forming the intermediate layer.

18. The method of manufacturing the organic light-emitting display apparatus as claimed in claim 17, further comprising forming the opposite electrode corresponding to the plurality of pixel electrodes after forming the intermediate layer, wherein forming the opposite electrode includes forming the opposite electrode so as to contact an exposed portion of a plurality of areas of the shield layer by the third insulating layer.

19. The method of manufacturing the organic light-emitting display apparatus as claimed in claim 11, wherein the shield layer does not extend into the display area.

* * * * *